United States Patent [19]
Littleford et al.

[11] Patent Number: 4,888,565
[45] Date of Patent: Dec. 19, 1989

[54] APPARATUS FOR GENERATING ULTRASONIC SIGNALS

[75] Inventors: Gordon E. Littleford, Kings Lynn; Roy F. Underwood, Clifton, both of England

[73] Assignee: Kerry Ultrasonics Limited, Hertfordshire, England

[21] Appl. No.: 284,515

[22] Filed: Dec. 15, 1988

[30] Foreign Application Priority Data

Dec. 18, 1987 [GB] United Kingdom ................. 8729599

[51] Int. Cl.[4] .............................................. H03L 7/06
[52] U.S. Cl. ........................................ 331/25; 331/71; 331/158; 331/183; 310/316
[58] Field of Search ....................... 331/18, 23, 25, 65, 331/71, 116 R, 116 FE, 158, 159, 183, 185; 310/316, 317, 318, 319

[56] References Cited

U.S. PATENT DOCUMENTS 4,271,371  6/1981  Furuichi et al. ................. 331/25 X Primary Examiner—David Mis
Attorney, Agent, or Firm—Panitch, Schwarze, Jacobs & Nadel

[57] ABSTRACT

An ultrasonic generator, particularly for use in ultrasonic cleaning systems, provides a constant ultrasonic power output for a cleaning tank or chamber. A generator output stage fed from an unsmoothed mains power supply receives signals from an oscillator via a pulse-width modulation circuit. A power control feedback loop monitors the mains current, or alternatively the output signal from the output stage, and provides a compensation signal to the pulse-width modulation circuit. A frequency control feedback loop senses the current in the output from the output stage and tunes the generator for maximum current in this output.

13 Claims, 2 Drawing Sheets

APPARATUS FOR GENERATING ULTRASONIC SIGNALS

FIELD OF THE INVENTION

This invention relates to ultrasonic generators. The invention is particularly concerned with the generation of ultrasonic signals for use in ultrasonic cleaning systems.

The apparatus of the present invention provides an ultrasonic generator system which has a number of distinct advantages as compared with existing systems. It is one object of the present invention to be able to ensure a constant ultrasonic power output from the generator to the cleaning tank. It is desirable that the generator should be able to maintain the power output constant to within 1 dB in spite of changes in tank liquid height, temperature and mains voltage.

SUMMARY OF THE INVENTION

This is achieved in accordance with the invention by an ultrasonic generator comprising an oscillator, an output stage fed from a mains supply, receiving signals from the oscillator and arranged to provide an ultrasonic output signal, and power control means comprising sensing means to monitor the mains supply to the output stage or the output signal from the output stage and pulse-width modulation means connected to the sensor means and arranged to provide a correction signal to the output stage to maintain the mains supply current or the ultrasonic power output constant for a constant mains supply voltage.

Preferably, the sensing means monitors the mains current drawn by the output stage.

The sensing means may comprise a current transformer which is connected into a mains supply line to the output stage.

Preferably the ultrasonic generator provides also for frequency tuning. This can be achieved by the provision of frequency control means arranged to sense the current in the output from the output stage and to tune the generator for maximum current in this output.

Preferably, this is achieved by the frequency control means comprising a phase-lock loop circuit. By this means one can achieve a clean and consistent feedback signal of the correct phase relationship even when the actual feedback signal momentarily falls to zero. A further advantage of the frequency control means of the present invention is that this avoids the need for bulky high voltage components such as a power inductor or capacitor.

It is another object of the invention to provide both power control and frequency control in the ultrasonic generator.

This is achieved in accordance with the invention by an ultrasonic generator comprising a low-level oscillator, pulse-width modulation means connected to the output of the oscillator, an output stage connected to the output of the pulse-width modulation means, said output stage being connected to a mains supply and being arranged to develop an output for application to a cleaning tank or chamber, a power control feedback loop arranged to control the pulse-width modulation means, and a frequency control feedback loop arranged to control the oscillator.

It is desirable that the ultrasonic generator should give ease of starting and in which the output stage can be independently optimised for best running conditions. This is not possible with the conventional self-oscillating power stage used in such generators. According to a preferred feature of the present invention this object is achieved by an ultrasonic generator which comprises an oscillator and a separate output stage. This gives the desired ease of starting, because oscillation will occur without a feedback signal initially being present. It also means that the output stage can readily be adjusted independently of the oscillator for optimum running conditions.

It is a preferred feature of the present invention that the aforesaid output stage of the generator should be a direct-off-line output stage and should preferably be a Class D switching output stage. This has the advantage of high efficiency and avoids the need for a bulky mains transformer.

It is a further preferred feature of the generator of the present invention that it has a soft-start facility which reduces shock to power components at initial switch-on and which creates negligible switch-on surges. This means that contactor or relay ratings of associated equipment supplying power to the generator need not be so conservatively rated as is customary.

The generator of the present invention also has the ability to survive a short-circuit load and preferably incorporates an interlock circuit to power down if the load system is disconnected.

BRIEF DESCRIPTION OF THE DRAWINGS

In order that the invention may be more fully understood, one presently preferred embodiment of ultrasonic generator in accordance with the invention will now be described by way of example and with reference to the accompanying drawings, in which.

DETAILED DESCRIPTION OF THE PREFERRED EMBODIMENT

Figure 1:
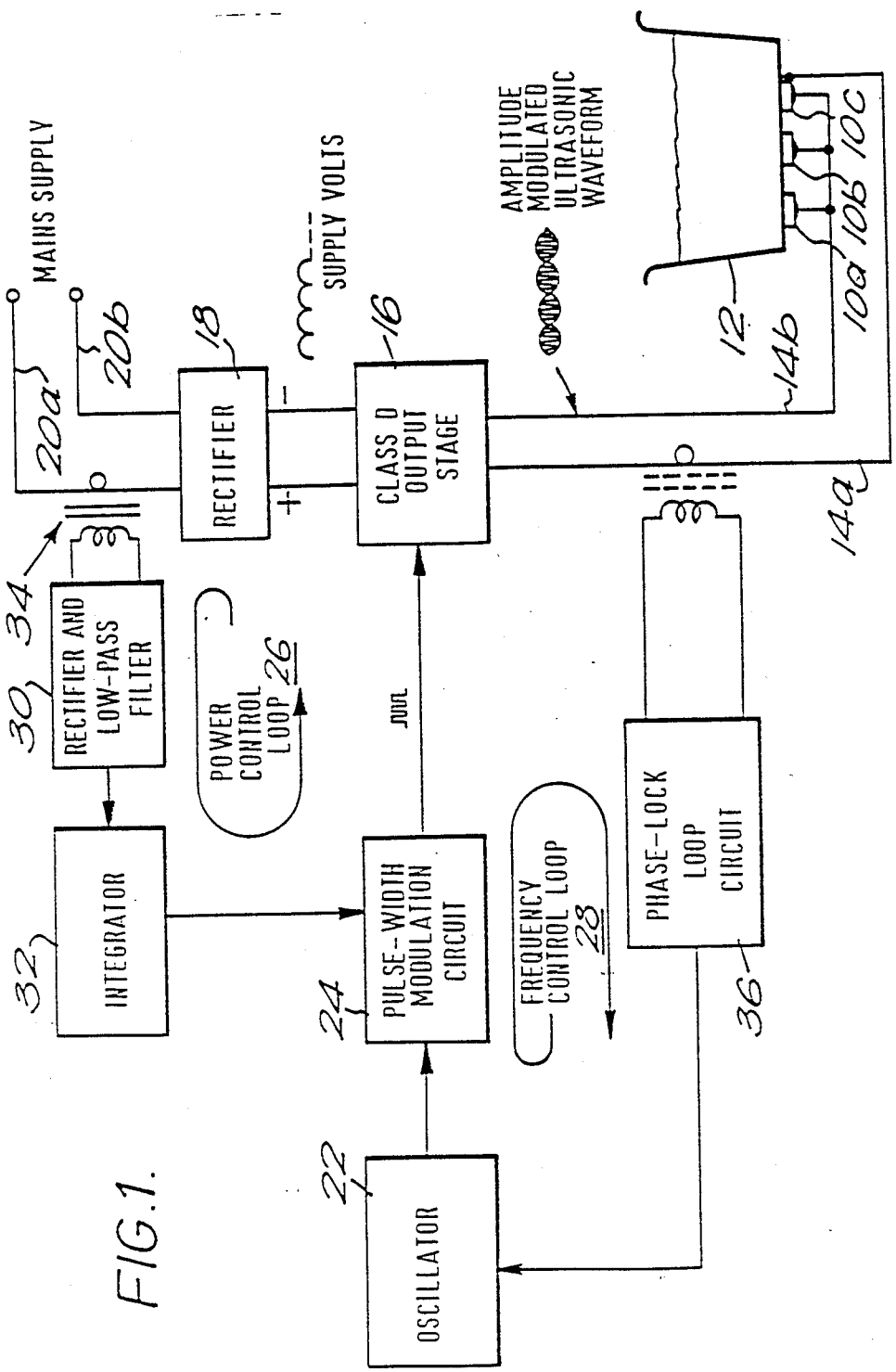
FIG. 1 is a block schematic circuit diagram of an ultrasonic generator in accordance with the invention.

Referring first to FIG. 1, this shows the ultrasonic generator of the present invention connected to three transducers 10a, 10b and 10c mounted on the wall of a cleaning tank 12. The transducers 10a, 10b and 10c are fed with an amplitude modulated ultrasonic waveform over output lines 14a and 14b from a Class D switching output stage 16 of the generator. The Class D output stage 16 is connected to the output of a rectifier 18 which is connected to an AC mains supply over input lines 20a and 20b. The ultrasonic generator comprises a low-level oscillator 22 whose output is fed to a pulse-width modulation circuit 24 which provides output pulses to the Class D switching output stage 16. The generator includes two feedback loops; a power control loop, indicated generally at 26, and a frequency control loop, indicated generally at 28. The power control loop 26 comprises a rectifier and low pass filter 30, and an integrator 32. The input to the rectifier and low pass filter circuit 30 is derived from a current transformer 34 which is connected into the mains supply input line 20a. The output of the integrator 32 is fed to the pulse-width modulation circuit 24.

The frequency control loop 28 comprises a phase-lock loop circuit 36. The input to the phase-lock loop circuit 36 is derived by sensing the current in the output line 14a to the cleaning tank, and the output of the phase-lock loop circuit 36 is fed to the oscillator 22.

Figure 2:
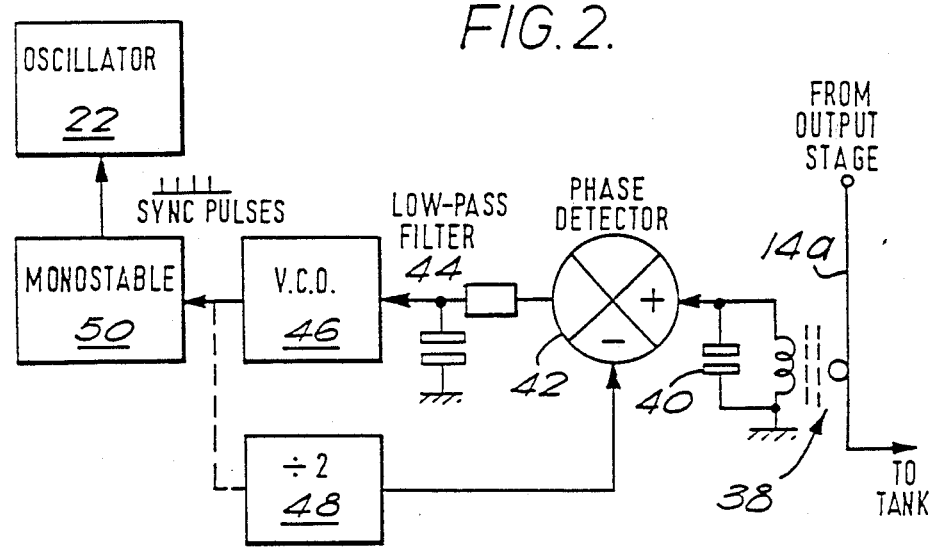
FIG. 2 is a block schematic circuit diagram which shows the frequency control loop of the generator in more detail; and, FIG. 3 is a block schematic circuit diagram showing the power control loop of the generator in more detail.

FIG. 2 shows the frequency control loop 28 in greater detail. Frequency control within the generator is achieved in the following manner. The ultrasonic current in the output line 14a to the tank is sensed, and the frequency control feedback loop tunes the generator for maximum current in this line 14a. A small toroidal ring, indicated generally at 38, is used to sense the current in line 14a. A capacitor 40 is connected in parallel with the toroidal ring and functions as a low-pass filter, thus providing a voltage output with clean waveform characteristics which is fed to a phase detector 42 which forms part of the phase-lock loop circuit 36. An important feature of the sensing ring 38 and capacitor 40 combination is that it provides approximately 90 degrees of phase shift to the signal. The advantage of this will become apparent hereinafter. The output of the phase detector 42 is fed by way of a low-pass filter 44 to a voltage-controlled oscillator 46. The phase-lock loop circuit which consists of the phase detector 42, the low-pass filter 44 and the voltage-controlled oscillator 46, is provided with a local feedback path which incorporates a divide by two network 48. By this means the output frequency of the phase-lock loop circuit is doubled. This is necessary in the preferred embodiment of the invention in order to drive the particular chosen integrated circuit which contains the ramp and drive circuits for the low level oscillator 22 and for the pulse width modulation circuit 24. The phase-lock loop circuit has a narrow lock and capture range setting, so that one can consistently lock on to one frequency. The phase-lock loop circuit is tunable by a potentiometer and effectively provides a fine frequency or phase tuning. The low-pass filter 44 provides a continuous DC voltage control on the voltage-controlled oscillator 46 and ensures a stable output frequency at all times.

As the supply voltage for the output stage 16 is only rectified mains supply and is not smoothed, the ultrasonic output to the tank on lines 14a and 14b is amplitude modulated at the rate of 100 cycles per second. Hence, the ultrasonic feedback signal in the frequency control loop will periodically fall to zero. However, the low-pass filter 44 will maintain a control voltage and hold the frequency control loop in tune during this momentary loss of feedback. The phase-lock loop circuit 36 which is used has an inherent 90 degree phase shift at its centre frequency. Coupled with the 90 degree phase shift provided at the input to the phase-lock loop circuit, a 180 degree total phase shift in the feedback path is achieved. The output of the voltage-controlled oscillator 46 is fed to a monostable circuit 50 which generates narrow sync pulses for the low-level oscillator 22 in the forward path.

Figure 3:
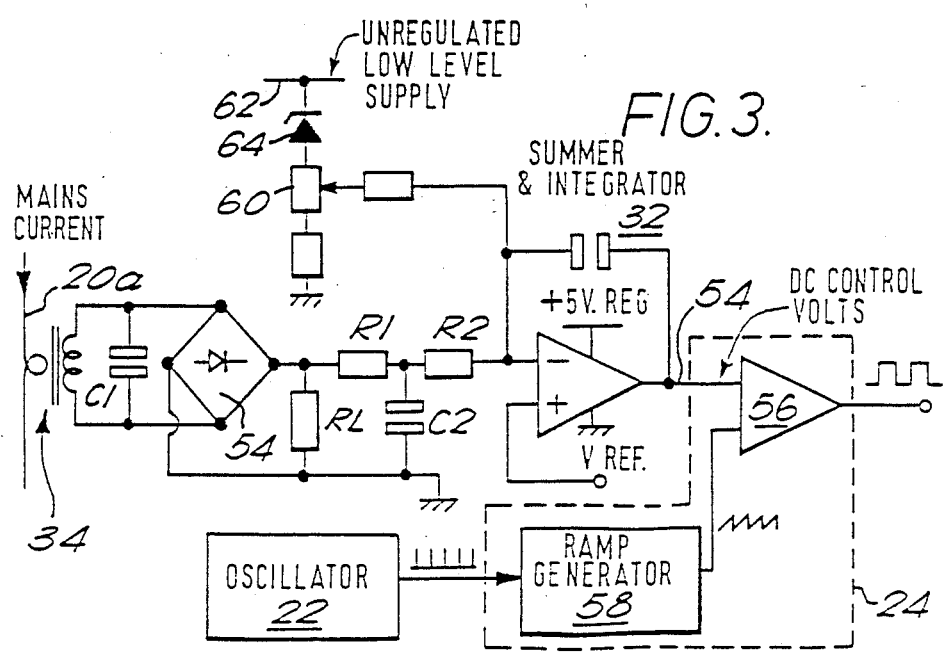

Details of the power control circuit are shown in Fig. 3. Power control is achieved by monitoring the mains current drawn by the output stage 16 and controlling the pulse width of the ultrasonic drive signal to the output stage 16 in order to maintain the mains current constant. Power drawn is proportional to current as long as the supply voltage remains constant. The mains voltage is reasonably constant but provision is made within the circuit for dealing with typical mains variations. As the output stage 16 is Class D and inherently efficient, in fact approximately 90% efficient, one can assume that mains current drawn is proportional to ultrasonic output power. Therefore, by holding the mains current constant, the ultrasonic output power is also held constant.

As shown in FIG. 3, the current transformer 34 has in its secondary circuit a capacitor C1 which removes any ultrasonic component present, a rectifier 54, and a suitable value load resistor RL. A signal voltage proportional to the mains current in line 20a is thus derived by the load resistor. This signal voltage is then further filtered and smoothed by a resistor R1 and capacitor C2. The signal is then applied by way of a resistor R2 to the integrator 32. This integrator 32 has a long time constant as compared to motion generated within the cleaning tank 12, in order to generate a proportional gain control signal. The resultant DC control voltage on line 54 is fed to the pulse width modulation circuit 24 (indicated in FIG. 3 within broken lines). This pulse-width modulation circuit comprises a comparator 56 and a ramp generator 58. The ramp generator 58 receives an input signal from the oscillator 22 and its output ramp voltage is fed to one input of the comparator 56, the other input of which is the voltage signal on line 54. The pulse-width modulated signal from the output of the comparator 56 is fed to the Class D output stage 16, as shown in FIG. 1.

The integrator 32 also creates signal inversion, and thus produces negative feedback. This means that an increase in mains current on line 20a creates a reduction in pulse width which in turn pulls the current down towards the set-point. A set-point potentiometer 60 is connected across an unregulated DC supply rail 62 for the low level electronics. Hence, variations in the mains voltage are reflected into this circuit and summed into the integrator. A zener diode 64 is chosen to reflect the optimum variation across the set-point potentiometer 60.

It will thus be appreciated that in the generator of the present invention power is sensed at a mains rate and a correction signal is applied to the ultrasonic circuit. In other words, a.c. mains current is sensed with compensation for mains voltage variation being achieved by sensing the low level d.c. voltage rail. This is considered to be a preferable method of maintaining constant output power to methods which involve removing part of the mains waveform in response to variations in mains current. Removing part of the mains waveform has been found to cause a deterioration in the cleaning action in water-based solutions. The larger the part of the waveform which is removed, the more this adversely affects the cleaning action. Unsmoothed power supplies are used in most, if not all, ultrasonic cleaning generators. Leaving the smoothing or reservoir capacitor out of circuit gives markedly improved cleaning results even though the average ultrasonic power falls to about half under such circumstances. The peak-to-mean power ratio is of great importance in maintaining a good cleaning action. Hence, the use of unsmoothed supplies. However, removing part of the mains cycle waveform has definite disadvantages, and hence the adoption of ultrasonic pulse-width control in the preferred embodiment of the present invention.

In the preferred embodiment described above, power is sensed using mains current. Alternatively, one could sense power using the ultrasonic current, although this is somewhat less advantageous. It would mean using the same or a similar controlling element for controlling power and frequency, and this could result in a possible interaction between the power control loop 26 and the frequency control loop 28. However, this alternative method of control is not to be considered as excluded from the scope of the present invention.

We claim:

1. An ultrasonic generator comprising an oscillator, an output stage which is fed from a mains supply, which receives signals from the oscillator and which is arranged to provide an ultrasonic output signal, and power control means comprising sensing means to monitor the mains supply to the output stage and pulse-width modulation means connected to the sensor means and arranged to provide a correction signal to the output stage to maintain the mains supply current or the ultrasonic power output constant for a constant mains supply voltage.

2. An ultrasonic generator according to claim 1, in which the output signal from said output stage is an amplitude modulated signal.

3. An ultrasonic generator according to claim 1, in which the sensing means monitors the mains current drawn by the output stage.

4. An ultrasonic generator according to claim 1, in which the sensing means comprises a current transformer which is connected into a mains supply line to the output stage.

5. An ultrasonic generator according to claim 4, in which the transformer output is fed through rectifier means and filter means to produce a signal voltage proportional to the mains supply current, the signal voltage being applied to integrator means which provides a control voltage for the pulse-width modulation means.

6. An ultrasonic generator according to claim 5, in which the control voltage from the integrator means is a proportional gain control signal.

7. An ultrasonic generator according to claim 5, in which the integrator means is such that an increase in the mains supply current produces a reduction in the width of the output pulses from the pulse-width modulation means.

8. An ultrasonic generator according to claim 1, in which the output stage is a Class D switching output stage.

9. An ultrasonic generator according to claim 1, in which said oscillator is separate from said output stage, thereby to permit the output stage to be adjusted independently of the oscillator.

10. An ultrasonic generator according to claim 1, which includes frequency control means arranged to sense the current in the output from the output stage and to tune the generator for maximum current in this output.

11. An ultrasonic generator according to claim 10, in which the frequency control means comprises a phase-lock loop circuit having its input derived from sensing the current in the output from said output stage and having its output fed to said oscillator.

12. An ultrasonic generator comprising an oscillator, an output stage which is fed from a mains supply, which receives signals from the oscillator and which is arranged to provide an ultrasonic output signal, and power control means comprising sensing means to monitor the output signal from the output stage and pulse-width modulation means connected to the sensor means and arranged to provide a correction signal to the output stage to maintain the mains supply current or the ultrasonic power output constant for a constant mains supply voltage.

13. An ultrasonic generator comprising a low-level oscillator, pulse-width modulation means connected to the output of the oscillator, an output stage connected to the output of the pulse-width modulation means, said output stage being connected to a mains supply and being arranged to develop an output for application to a cleaning tank or chamber, a power control feedback loop arranged to control the pulse-width modulation means, and a frequency control feedback loop arranged to control the oscillator.

* * * * *